United States Patent
Wang et al.

(10) Patent No.: US 9,776,914 B2
(45) Date of Patent: Oct. 3, 2017

(54) CHEMICAL VAPOR DEPOSITION PROCESS FOR DEPOSITING ZINC OXIDE COATINGS, METHOD FOR FORMING A CONDUCTIVE GLASS ARTICLE AND THE COATED GLASS ARTICLES PRODUCED THEREBY

(71) Applicant: PILKINGTON GROUP LIMITED, Lathom (GB)

(72) Inventors: Yu Wang, Greensboro, NC (US); Srikanth Varanasi, Ottawa Hills, OH (US); David Alan Strickler, Toledo, OH (US)

(73) Assignee: Pilkington Group Limited, Lathom (GB)

(*) Notice: Subject to any disclaimer, the term of this patent is extended or adjusted under 35 U.S.C. 154(b) by 351 days.

(21) Appl. No.: 13/261,951

(22) PCT Filed: Mar. 8, 2013

(86) PCT No.: PCT/GB2013/050585
§ 371 (c)(1),
(2) Date: Sep. 11, 2014

(87) PCT Pub. No.: WO2013/136052
PCT Pub. Date: Sep. 19, 2013

(65) Prior Publication Data
US 2015/0017431 A1    Jan. 15, 2015

Related U.S. Application Data

(60) Provisional application No. 61/611,715, filed on Mar. 16, 2012.

(51) Int. Cl.
*C23C 16/00*     (2006.01)
*C03C 17/34*     (2006.01)
(Continued)

(52) U.S. Cl.
CPC ........ *C03C 17/3417* (2013.01); *C03C 17/245* (2013.01); *C23C 16/407* (2013.01);
(Continued)

(58) Field of Classification Search
CPC ............ C23C 16/407; C23C 16/45595; C23C 16/545
See application file for complete search history.

(56) References Cited

U.S. PATENT DOCUMENTS 4,187,336 A    2/1980   Gordon
4,206,252 A *   6/1980   Gordon ................... C03C 17/00
                                                                  427/160
(Continued)

FOREIGN PATENT DOCUMENTS

WO     2012/129358 A1    9/2012

*Primary Examiner* — Kelly M Gambetta
(74) *Attorney, Agent, or Firm* — Marshall & Melhorn, LLC

(57) ABSTRACT

A CVD process for depositing a zinc oxide coating is provided. The CVD process includes providing a moving glass substrate. The CVD process also includes forming a gaseous mixture of an alkyl zinc compound and an inert gas as a first stream, providing a first gaseous inorganic oxygen-containing compound in a second stream and providing a second gaseous inorganic oxygen-containing compound in the second stream, a third stream or in both the second and third streams. Additionally, the CVD process includes mixing the streams at or near a surface of the moving glass substrate and a zinc oxide coating is formed thereon. A method for forming a coated glass article is also provided. Additionally, a coated glass article is provided.

10 Claims, 4 Drawing Sheets

(51) Int. Cl.
*C23C 16/40* (2006.01)
*C23C 16/455* (2006.01)
*C23C 16/54* (2006.01)
*C03C 17/245* (2006.01)

(52) U.S. Cl.
CPC ...... *C23C 16/45595* (2013.01); *C23C 16/545* (2013.01); *C03C 2217/94* (2013.01); *C03C 2218/1525* (2013.01); *Y10T 428/265* (2015.01)

(56) References Cited

U.S. PATENT DOCUMENTS

| | | | |
|---|---|---|---|
| 4,419,386 A | | 12/1983 | Gordon |
| 5,094,882 A | * | 3/1992 | Platts ................. C03C 17/25 427/110 |
| 5,496,583 A | | 3/1996 | Jansen |
| 6,071,561 A | * | 6/2000 | Gordon ................ C23C 16/407 427/126.3 |
| 7,740,901 B2 | | 6/2010 | Abrams et al. |
| 2008/0057225 A1 | * | 3/2008 | Stricker ............... C03C 17/245 427/585 |
| 2008/0063793 A1 | | 3/2008 | Abrams |
| 2009/0305057 A1 | | 12/2009 | Ye |
| 2011/0088774 A1 | | 4/2011 | Gromball et al. |
| 2011/0244140 A1 | * | 10/2011 | Takano ................ C23C 16/407 427/488 |
| 2012/0240627 A1 | | 9/2012 | Nelson et al. |
| 2012/0240634 A1 | | 9/2012 | Sanderson et al. |

\* cited by examiner

US 9,776,914 B2

CHEMICAL VAPOR DEPOSITION PROCESS FOR DEPOSITING ZINC OXIDE COATINGS, METHOD FOR FORMING A CONDUCTIVE GLASS ARTICLE AND THE COATED GLASS ARTICLES PRODUCED THEREBY

CROSS-REFERENCE TO RELATED APPLICATION

This application is claiming the benefit, under 35 U.S.C. 119(e), of the provisional application which was granted Ser. No. 61/611,715 filed on Mar. 16, 2012, the entire disclosure of which is hereby incorporated by reference.

BACKGROUND OF THE INVENTION

The invention relates to a process for depositing a zinc oxide coating. More specifically, the invention relates to a chemical vapor deposition (CVD) process for depositing a zinc oxide coating. The invention also relates to a method for forming a coated glass article and a glass article coated with a layer of zinc oxide having certain desired properties.

Zinc oxide coatings are known to be deposited on glass substrates. However, the processes known for the production of the zinc oxide coatings are limited. For example, known process for depositing zinc oxide coatings can damage coating layers previously deposited on the glass substrate. Thus, formation of zinc oxide coatings over certain coating layers is problematic or, alternatively, the layers over which the zinc oxide can be deposited are limited. Therefore, it would be desirable to provide an improved process which is more robust than the known processes utilized for the formation of zinc oxide coatings. The resulting coated glass article would also be desirable.

BRIEF SUMMARY OF THE INVENTION

A chemical vapor deposition process for depositing a zinc oxide coating is provided. In an embodiment, the chemical vapor deposition process comprises providing a moving glass substrate. The chemical vapor deposition process also comprises forming a gaseous mixture of an alkyl zinc compound and an inert gas as a first stream, providing a first gaseous inorganic oxygen-containing compound in a second stream, and providing a second gaseous inorganic oxygen-containing compound in the second stream, a third stream or in both the second and the third streams. The gaseous streams are mixed at or near a surface of the moving glass substrate to form a zinc oxide coating thereon.

Also, a method for forming a coated glass article is provided. In an embodiment, the method for forming the coated glass article comprises providing a glass substrate having a coating of conductive tin oxide deposited thereon. The method also comprises forming a gaseous mixture comprising a gaseous zinc-containing compound, a first gaseous inorganic oxygen-containing compound, a second gaseous inorganic oxygen-containing compound, and inert gas over the conductive tin oxide coating. The gaseous mixture reacts to deposit a zinc oxide coating over the conductive tin oxide coating and the sheet resistance is maintained within 0.5 Ohms/sq.

In addition, a coated glass article is provided. In an embodiment, the coated glass article comprises a glass substrate, a fluorine doped tin oxide coating deposited on the glass substrate and a zinc oxide coating deposited over the fluorine doped tin oxide coating. The coated glass article exhibits a sheet resistance of less than 15 Ohms/sq.

BRIEF DESCRIPTION OF THE DRAWINGS

The above, as well as other advantages of the present invention will become readily apparent to those skilled in the art from the following detailed description when considered in the light of the accompanying drawings in which.

DETAILED DESCRIPTION OF THE INVENTION

Figure 1:
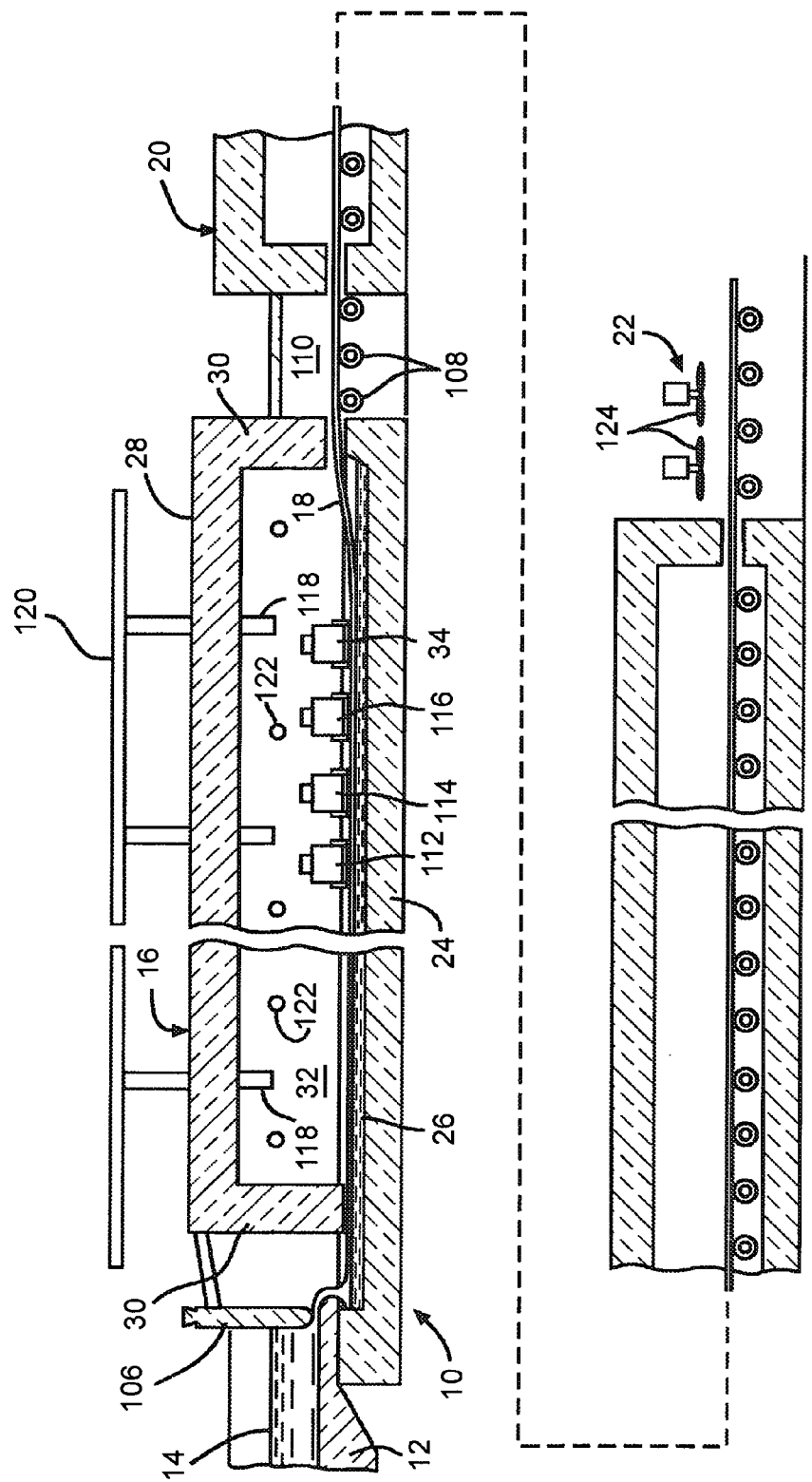
FIG. 1 is a schematic view, in vertical section, of an installation for practicing the float glass process, which includes four coating apparatuses suitably positioned in the float bath to form coatings over the glass substrate in accordance with certain embodiments of the invention.

It is to be understood that the invention may assume various alternative orientations and step sequences, except where expressly specified to the contrary. It is also to be understood that the specific processes, methods, apparatuses, and articles illustrated in the attached drawings and described in the following specification are simply exemplary embodiments of the inventive concepts. Hence, specific dimensions, directions, or other physical characteristics relating to the embodiments disclosed are not to be considered as limiting, unless expressly stated otherwise. Also, although they may not be, like elements in the various embodiments described within this section of the application may be commonly referred to with like reference numerals.

In an embodiment, a CVD process for depositing a zinc oxide coating (hereinafter also referred to as "CVD process") is provided. In certain embodiments, the CVD process will be described in connection with forming a coated glass article. The coated glass article may have many uses and/or can be used in many applications. For example, the coated glass article may be used as a superstrate in the manufacture of solar cells. However, it would be understood by one of ordinary skill in the art that the coated glass article could also be utilized as a substrate in the manufacture of solar cells. Furthermore, the coated glass article described herein is not limited to use in solar cell applications. For example, in certain embodiments, the coated glass article may be utilized in architectural glazings. Also, the coated glass article may be utilized in electronics and/or have automotive and aerospace applications.

For describing certain embodiments disclosed herein, the zinc oxide coating may be designated by utilizing the chemical formula ZnO. Most preferably, the zinc oxide coating contains primarily zinc and oxygen, and possibly containing trace contaminants of, for example, of carbon. In referring to this embodiment, the zinc oxide coating may be described as "undoped." However, in certain embodiments, the zinc oxide coating may be doped or co-doped such that it includes zinc, oxygen and at least one dopant material. In an embodiment, the zinc oxide coating is a pyrolytic coating.

The CVD process comprises providing a glass substrate. The glass substrate has a deposition surface over which the zinc oxide coating is formed. Within this section of the application, the glass substrate may be designated by either of reference numbers 18 or 84.

In certain embodiments, the CVD process is practiced under dynamic deposition conditions. In these embodiments, the CVD process comprises providing a moving glass substrate, i.e. the glass substrate is moving at the time of forming the zinc oxide coating. Preferably, the glass substrate is moving at a predetermined rate of, for example, greater than 3.175 meters per minute (m/min) (125 in/min). More preferably, the glass substrate is moving at a rate of between 3.175 m/min (125 in/min) and 12.7 m/min (600 in/min) during formation of the zinc oxide coating.

In an embodiment, the glass substrate is substantially transparent. In this embodiment, the glass substrate may be a soda-lime-silica glass. However, the CVD process is not limited to a particular glass substrate composition as, in certain embodiments, the glass substrate may be a borosilicate glass. Additionally, the invention is not limited to transparent glass substrates as translucent glass substrates may also be utilized in practicing the CVD process. Also, the transparency or absorption characteristics of the glass substrate may vary between embodiments of the CVD process. For example, it may be preferable to utilize a glass substrate having a low iron content in the CVD process described herein. Further, the CVD process can be practiced utilizing clear or colored glass substrates and is not limited to a particular glass substrate thickness.

In certain embodiments, the glass substrate is heated. In these embodiments, the temperature of the glass substrate may be greater than 1050° F. (566° C.). Preferably, the temperature of the glass substrate is between about 1050° F. (566° C.) and 1400° F. (760° C.) when the zinc oxide coating is formed thereon. Thus, the CVD process surprisingly allows for the formation of the zinc oxide coating at high temperatures.

Additionally, in certain embodiments, a surface of the glass substrate is at essentially atmospheric pressure when the zinc oxide coating is formed thereon. In these embodiments, the CVD process is an atmospheric pressure CVD (APCVD) process. In other embodiments, the CVD process may be practiced under low pressure conditions.

The CVD process may be carried out in conjunction with the manufacture of the glass substrate. For instance, the zinc oxide coating may be deposited on a glass substrate during the formation of the glass substrate. Preferably, the glass substrate is formed utilizing the well-known float glass manufacturing process. In these embodiments, the glass substrate may be referred to as a glass ribbon. An exemplary illustration of a float glass installation 10 utilized in the float glass manufacturing process is shown in FIG. 1.

As illustrated in FIG. 1, the float glass installation 10 utilized may comprise a canal section 12 along which molten glass 14 is delivered from a melting furnace (not depicted), to a float bath section 16 wherein a continuous glass ribbon 18 is formed in accordance with the well-known float glass process. The glass ribbon 18 advances from the float bath section 16 through an adjacent annealing lehr 20 and a cooling section 22. The float bath section 16 includes a bottom section 24 within which a bath of molten tin 26 is contained, a roof 28, opposite sidewalls (not shown) and end walls 30. The roof 28, sidewalls and end walls 30 together define a chamber 32 in which a non-oxidizing atmosphere is maintained to prevent oxidation of the molten tin 26. However, as the float glass installation described herein and shown in FIG. 1 is only illustrative of such installations, it is not limiting as to the invention.

Figure 2:
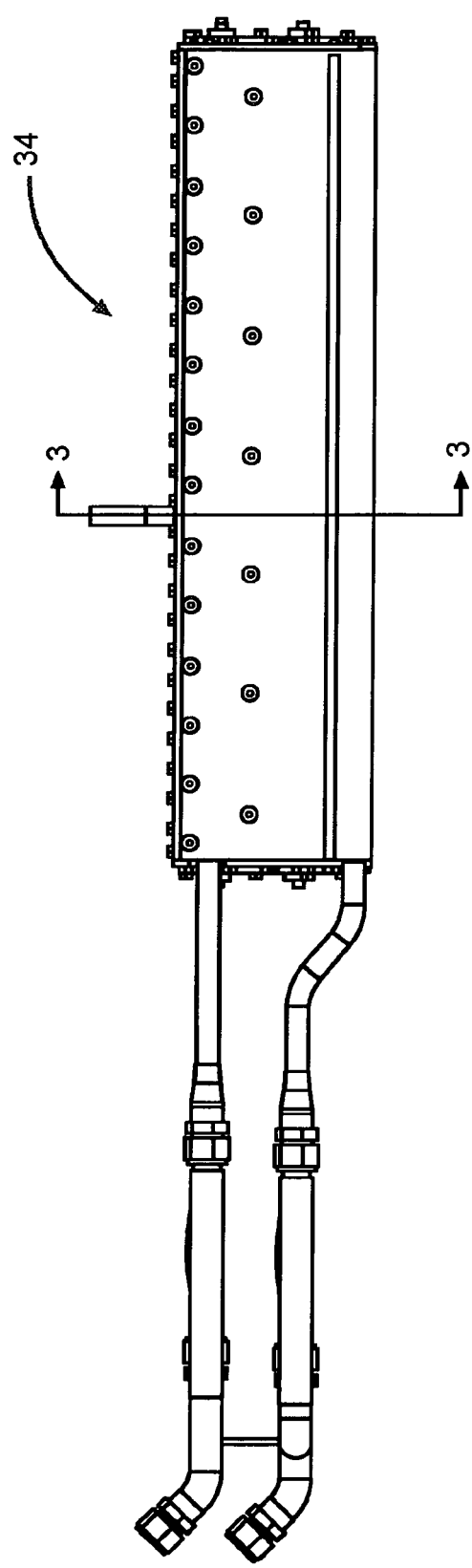
FIG. 2 is a side view of an embodiment of a coating apparatus of FIG. 1.
Figure 3:
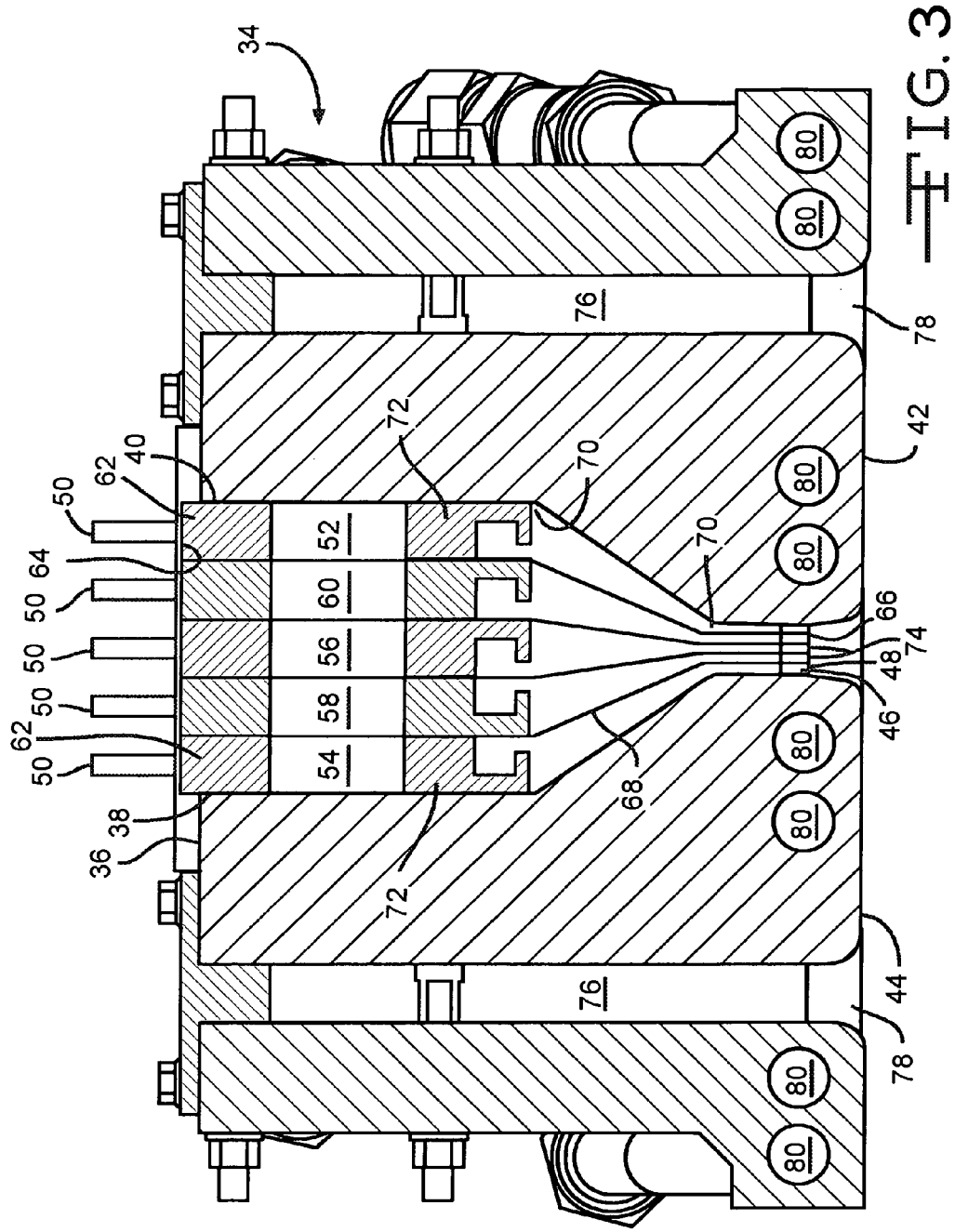
FIG. 3 is a cross-sectional view of an embodiment of the coating apparatus of FIG. 2.

Additionally, the CVD process may comprise providing a coating apparatus. A coating apparatus 34 suitable for use in the CVD process is illustrated in FIGS. 1-3. Also, a description of a coating apparatus suitable for practicing the present invention can be found in U.S. patent application Ser. No. 13/426,697, the entire disclosure of which is hereby incorporated by reference.

As best illustrated in FIG. 3, in an embodiment, the coating apparatus 34 comprises a main body 36. The main body 36 has a pair of sidewalls 38, 40 and at least one face 42, 44. In certain embodiments, a pair of faces 42, 44, each of which is attached to a sidewall 38, 40, may be provided. The coating apparatus 34 may also comprise one or more flow conditioners 46. When provided, the one or more flow conditioners 46 are positioned between the pair of sidewalls 38, 40. Preferably, the distance from the face 42, 44 to an outlet end 84 of the one or more flow conditioners 46 is about 6.4-102 millimeters (mm) and, preferably, is equal to or greater than 25.4 mm.

In an embodiment, the coating apparatus 34 is provided at a predetermined distance above the glass substrate. More specifically, in an embodiment, the main body 36 is provided at a predetermined distance above the glass substrate and extends transversely over the substrate. As measured from the face 42, 44, the coating apparatus 34 may be at a predetermined distance above the glass substrate of from 2-30 mm. More preferably, as measured from the face 42, 44, the coating apparatus 34 is at a predetermined distance above the glass substrate of from about 2-10 mm. In these embodiments, the face 42, 44 is positioned over and in a parallel relationship with the glass substrate and the sidewalls 38, 40 are in a perpendicular relationship with the glass substrate.

The coating apparatus 34 is preferably located at, at least, one predetermined location. As shown in FIG. 1, when the glass substrate is a glass ribbon 18, the coating apparatus 34 may be located in the float bath chamber 32. However, in other embodiments, the coating apparatus may be located in the annealing lehr 20 or in a gap 110 between the float bath chamber 32 and the annealing lehr 20.

The CVD process may comprise providing a source of a gaseous zinc-containing compound, a source of a first gaseous oxygen-containing compound, a source of a second gaseous oxygen-containing compound, a source of a gaseous additive compound, and a source of one or more inert gases. In an embodiment (not depicted), these sources are provided at a location outside the float bath chamber. Separate supply lines extend from the sources of gaseous reactant (precursor) compounds and, similarly, from the source(s) of inert gas(es).

As used herein, the phrases "gaseous reactant compound" and "gaseous precursor compound" may be used interchangeably to refer any or all of the gaseous zinc-containing compound, the first gaseous oxygen-containing compound, the second gaseous oxygen-containing compound, and the gaseous additive compound and/or to describe the various embodiments thereof disclosed herein.

As would be appreciated by those skilled in the art, the materials suitable for use as the gaseous zinc-containing compound, the first gaseous oxygen-containing compound, the second gaseous oxygen-containing compound, and the gaseous additive compound should be suitable for use in a CVD process. Such materials may at some point be a liquid or a solid but are volatile such that they can be vaporized to be in a gaseous state for use in the CVD process. Once in a gaseous state, the compounds can be included in a gaseous stream and utilized in the CVD process to form the zinc oxide coating.

The zinc oxide coating formed by the CVD process may utilize any combination of suitable gaseous precursor compounds.

In an embodiment, the gaseous zinc-containing compound is an organic zinc compound. Preferably, the organic zinc compound is an alkyl zinc compound such as diethyl zinc (DEZ) or, more preferably, dimethyl zinc (DMZ). It should be appreciated that additional organic zinc compounds may be suitable for use in the CVD process. Furthermore, it should be appreciated that the zinc compound need not be an organic zinc compound to practice the CVD process.

In an embodiment, the first gaseous oxygen-containing compound is an inorganic oxygen-containing compound. Preferably, the first gaseous inorganic oxygen-containing compound is water ($H_2O$).

In an embodiment, the second gaseous oxygen-containing compound is an inorganic oxygen-containing compound. Preferably, the second gaseous inorganic oxygen-containing compound is oxygen ($O_2$). Oxygen may be provided as a part of a gaseous composition such as air or in a substantially purified form. In either embodiment, oxygen is in the form of molecular oxygen.

It should be appreciated that additional and/or alternative inorganic oxygen-containing compounds may be suitable as either the first gaseous oxygen-containing compound or the second gaseous oxygen-containing compound.

In an embodiment, the gaseous additive compound is an organic compound. In another embodiment, the gaseous additive compound is an organic oxygen-containing compound. Preferably, the organic oxygen-containing compound is a diketone compound. In an embodiment, the diketone compound is acetyl acetone ($C_5H_8O_2$). For describing certain embodiments disclosed herein, acetyl acetone may be designated by the term "acac." However, in other embodiments, the gaseous additive compound is an acetyl acetone derivative. For example, trifluoroacetylacetone and/or hexafluoroacetylacetone may be utilized as an additive compound. Also, it should be appreciated that additional gaseous additive compounds may be suitable for use in practicing the CVD process and/or that alternative organic and organic oxygen-containing additive compounds may be suitable for use the process described herein.

Suitable inert gases include nitrogen ($N_2$), helium (He) and mixtures thereof. Thus, in an embodiment, the one or more inert gases are selected from the group consisting of $N_2$, He, and mixtures thereof. In certain embodiments, a stream may be composed primarily of the inert gas and possibly trace amounts of certain impurities. However, in streams where at least one gaseous precursor compound is included, the stream may also comprise inert carrier/diluent gas. Preferably, the inert carrier/diluent gas is either $N_2$, He or mixtures thereof.

As above-described, separate supply lines extend from the sources of gaseous reactant (precursor) compounds and, similarly, from the source(s) of inert gas(es). In certain embodiments, the supply lines extend to inlet openings 50 in the coating apparatus 34.

In an embodiment, a stream comprising one or more of the gaseous zinc-containing compound, first gaseous oxygen-containing compound, second gaseous oxygen-containing compound and/or inert gas(es) is introduced into two or more separate flow pathways 52, 54, 56, 58, 60 in the coating apparatus 34. In another embodiment, a stream which comprises the gaseous additive compound is introduced into the two or more separate flow pathways 52, 54, 56, 58, 60 in the coating apparatus 34.

In order to avoid certain gaseous precursors compounds from pre-reacting, i.e. reacting before being discharged from the coating apparatus, it is preferred that certain gaseous precursor compounds are provided in separate streams. For example, in an embodiment, the gaseous zinc-containing compound is provided in a stream and the first gaseous oxygen-containing compound and second gaseous oxygen-containing compound are provided in a separate stream. However, in certain embodiments, it may be preferable that certain gaseous precursor compounds are provided in the same stream. For example, in an embodiment, the gaseous zinc-containing compound and the gaseous additive compound is included in the same stream. Also, in an embodiment, the first gaseous oxygen-containing compound and second gaseous oxygen-containing compound are included in the same stream.

In an embodiment, the CVD process comprises forming a gaseous mixture comprised of an alkyl zinc compound and an inert gas as a first stream. In this embodiment, a first gaseous inorganic oxygen-containing compound is provided in a second stream and a second gaseous inorganic oxygen-containing compound is provided in the second stream, in a third stream, or in both the second and third streams. In another embodiment, the process further comprises providing the gaseous additive compound in a stream. The gaseous additive compound can be included in the first stream, the second stream, the third stream and/or in a fourth stream.

When a coating apparatus 34 is utilized, the various gaseous streams are kept separate, are preferably conditioned to a desired degree of laminarity, and, in certain embodiments, are maintained within a desired temperature range while being directed through the coating apparatus 34 in preparation for discharge from the coating apparatus 34 above the deposition surface of the glass substrate.

Before entering the coating apparatus 34, each stream is directed to an inlet opening 50. Each inlet opening 50 is in fluid communication with a flow pathway 52, 54, 56, 58, 60 provided in the coating apparatus 34. In an embodiment, a cover block 62 is provided for each flow pathway. In this embodiment, each inlet opening 50 extends through a cover block 62 to communicate with a flow pathway 52, 54, 56, 58, 60. Thus, the coating apparatus 34 may comprise a plurality of cover blocks 62. In certain embodiments, the cover blocks 62 are positioned at an end 64 of the flow pathway opposite an end 66 where the streams are discharged from the coating apparatus 34.

The flow pathways are separate and discrete, being designed to keep the various streams apart from one another in the coating apparatus 34. In an embodiment, the coating apparatus 34 comprises two or more flow pathways 52, 54, 56, 58, 60. In this embodiment, the two or more flow pathways 52, 54, 56, 58, 60 extend through the main body 36. However, the coating apparatus 34 may have many more than two flow pathways. For example, as illustrated in FIG. 3, the coating apparatus 34 may have five flow pathways 52, 54, 56, 58, 60 or more.

In an embodiment, the coating apparatus 34, specifically the main body 36, at least partially defines two or more flow pathways 52, 54. In certain embodiments, two flow pathways 52, 54 are partially defined by the sidewalls 38, 40 and a gas flow separator 68 positioned between by the sidewalls 38, 40. In certain embodiments, the coating apparatus 34 comprises a plurality of gas flow separators 68.

The streams of gaseous precursor compounds/inert gases are directed through the two or more flow pathways 52, 54, 56, 58, 60. The streams of gaseous precursor compounds/inert gases flow at a predetermined velocity through the two or more flow pathways 52, 54, 56, 58, 60. The velocities of the gaseous streams may be the same as, substantially equal to or different from a stream in an adjacent flow pathway.

The velocities at which the gaseous streams of gaseous precursor compounds/inert gases flow may be influenced by the configuration of the flow pathways. Preferably, each of the two or more flow pathways 52, 54, 56, 58, 60 has a slot-like configuration in which its length is greater than its width. In another embodiment, at least one of the flow pathways 56 is substantially straight. In other embodiments, at least one of the flow pathways 52, 54, 56, 58, 60 has a portion or portions which are substantially straight. In still further embodiments, at least one of the flow pathways 52, 54, 56, 58, 60 has a bend 70 connected to or connecting substantially straight portions of the flow pathway. In these embodiments, a flow pathway may also be configured to have a plurality of bends 70. The widths of certain flow pathways 54 may be the same or different from an adjacent flow pathway 58. In an embodiment, certain flow pathways 52, 54 are configured so that they are nearly identical in shape, length, and width.

The coating apparatus 34 may comprise a plurality of baffle blocks 72. Preferably, a baffle block 72 is located in each flow pathway 52, 54, 56, 58, 60 provided in the coating apparatus 34 between the cover block 62 and a flow conditioner 46. The baffle block 72 helps to distribute the gaseous stream uniformly, or at least to increase the uniformity of the gaseous stream, in the flow pathway.

Preferably, the coating apparatus 34 comprises one or more flow conditioners 46. In an embodiment, each flow pathway 52, 54, 56, 58, 60 has a flow conditioner 46 positioned therein. In an embodiment, each flow conditioner 46 is attached, preferably by a weld, to a side of at least one gas flow separator 68. Preferably each flow conditioner 46 is positioned adjacent an outlet opening 74 of the flow pathway. In an embodiment, each stream is directed through a flow conditioner 46 at a predetermined flow velocity to condition each stream, i.e. the flow conditioner increases the laminarity of the stream that is directed through it. In certain embodiments, the flow conditioner 46 provides the stream with a desired degree of laminarity or desired increase in laminarity.

The vertical dimension or "thickness" of the flow conditioner(s) 46 may vary depending upon the extent to which the laminarity of the flow of a particular gaseous precursor stream is desired to be altered, although about 5 mm to about 25 mm is a preferred range for the vertical dimension of a conditioner 46. In an embodiment, at least one of the flow conditioners 46 in the coating apparatus 34 has a "honeycomb" configuration. A flow conditioner 46 having a honeycomb configuration may further increase the laminarity of the gas flowing through it. The dimensions of the cells of the honeycomb may vary in size and shape. A preferred area for each cell of the honeycomb is about 1 mm². However, it should be appreciated that the invention is not limited to a flow conditioner having a honeycomb configuration and that the dimensions provided to describe the dimensions of a particular flow conditioner embodiment are also not limiting to certain embodiments.

In an embodiment, a stream composed primarily of inert gas(es) is introduced into at least one flow pathway 52, 54, 56, 58, 60 in the coating apparatus 34. Suitable inert gases include $N_2$, He and mixtures thereof. In this embodiment, the stream may act as a barrier stream. As a barrier stream, the inert gas stream is preferably directed through a flow pathway positioned between flow pathways which have streams comprising gaseous precursor compounds flowing there through. In certain embodiments of the CVD process, two or more streams composed primarily of inert gas(es) are introduced into two or more separate flow pathways 58, 60 in the coating apparatus 34.

In the CVD process, mixing of the gaseous streams occurs by diffusion. Additionally, mixing of the gaseous streams begins very shortly after the gaseous streams are discharged from the coating apparatus 34. Since mixing of the gaseous streams occurs by diffusion, a barrier stream composed primarily of inert gas(es) delays mixing of the gaseous precursor compounds after the streams are discharged from the coating apparatus 34. This delay can be attributed to the additional time/diffusion required for the gaseous precursor compounds to diffuse through the inert gas stream before mixing with each other.

In one embodiment, the first stream comprising the gaseous zinc-containing compound, preferably an alkyl zinc compound, and inert gas is introduced into a first flow pathway 52 in the coating apparatus 34. In this embodiment, a second stream comprising the first gaseous oxygen-containing compound and second gaseous oxygen-containing compound is introduced into a second flow pathway 54 in the coating apparatus 34 and a gaseous stream composed of primarily inert gas is introduced into a third flow pathway 56, 58, 60 in the coating apparatus 34. The third flow pathway 56, 58, 60 is located between the first and second flow pathways 52, 54. In this embodiment, the stream composed primarily of inert gas delays the mixing of the gaseous precursor compounds once the streams are discharged from the coating apparatus 34. In these embodiments, a gaseous additive compound such as acetyl acetone may be introduced into the first stream in the first flow pathway 52.

The coating apparatus 34 may also comprise at least one exhaust gas passage 76. In certain embodiments, the at least one exhaust gas passage is at least partially defined by the main body 36. Each exhaust gas passage 76 includes an exhaust gas opening 78. The exhaust gas passage 76 allows for the continuous removal of spent or unused gaseous precursor compounds and/or inert gases which might otherwise create undesired contaminants on the deposition surface of the substrate. Such gaseous exhaust extraction may also be utilized to influence the amount of gas flow turbulence and the rate at which mixing occurs at or near the deposition surface of the glass substrate. Thus, the rate of exhaust extraction has the potential to affect the deposition rate of the zinc oxide coating.

The CVD process may comprise discharging the streams from the coating apparatus 34. Each stream is discharged from the coating apparatus 34 through an outlet opening 74. Each outlet opening 74 may have a width which is the same as or different than an adjacent outlet opening 74. Thus, in an embodiment, an outlet opening 74 has a width which is the same or substantially the same as the width of an adjacent outlet opening. In other embodiments, an outlet opening 74 can have a width which is larger or smaller than the width of an adjacent outlet opening.

The coating apparatus 34 maintains the gaseous streams in separate flow pathways in the coating apparatus 34 and even controls the flow path geometry for a time/distance once the streams have been discharged from the coating apparatus 34. In an embodiment, upon discharge from the flow conditioner 46, the gaseous streams are in still-separated flow paths as they proceed toward the deposition surface of the glass substrate for a time before they mix by diffusion.

It is preferred that the velocity of the flow of each stream is selected to control the degree of turbulence of the combined discharges of the streams. It should be appreciated that the higher the degree of turbulence, the greater the rate of diffusion between the streams once discharged from the coating apparatus 34. Therefore, turbulence may have a significant influence on coating deposition rates and uniformity of coating thickness.

In an embodiment, the flow velocity of each stream from each outlet opening 74 is selected to control the flow path geometry once the streams have been discharged from the coating apparatus 34. The flow velocity may be the same or different from one outlet opening to adjacent outlet opening depending on the objective desired. However, it may be preferable that the gas flow velocities are substantially equal from one outlet opening 74 to the next in order to achieve an acceptably low amount of turbulence.

Another method for controlling the flow path geometry for a time/distance once the streams have been discharged from the coating apparatus 34 is to control the temperature of the coating apparatus 34, particularly in the area proximate the flow conditioner(s) 46 and the outlet openings 74 to assist in maintaining the structural integrity of, for example, the flow conditioner(s) 46 which aids in preventing pre-reaction of the gaseous precursor compounds. Temperatures of the coating apparatus 34 are preferably controlled within + or −50° F. (10° C.) of a predetermined set point temperature by any suitable means and maybe accomplished using a suitable heat transfer medium in certain portions 80 of the coating apparatus 34.

The CVD process also comprises mixing the gaseous streams at or near the deposition surface of the glass substrate to form a zinc oxide coating thereon. It is important to note that mixing begins before the gaseous precursor compounds/inert gas(es) contact the deposition surface of the glass substrate. In certain embodiments, the mixing of the gaseous streams occurs in a space or mixing zone above the deposition surface of the glass substrate.

The CVD process results in the deposition of a high quality zinc oxide coating being formed on the glass substrate. In particular, zinc oxide coatings formed using the CVD process exhibit excellent coating thickness uniformity. For example, a zinc oxide coating which has a thickness of up to 100 nanometers (nm) can be uniformly deposited on the glass substrate.

When included in a gaseous stream or as part of a gaseous mixture, it is believed that the gaseous additive compound acts as a reaction rate modifier. While not wishing to be bound to a specific a theory of operation, it is believed that the gaseous additive compound may temporarily reduce the rate of reaction between the gaseous zinc-containing compound and the first and second gaseous oxygen-containing compounds. As above-noted, mixing of the gaseous streams occurs once the gaseous streams are discharged from the coating apparatus. As such, it would not be desirable for the gaseous zinc-containing compound and the first and second gaseous oxygen-containing compounds to begin reacting to form zinc oxide prior to reaching the deposition surface of the glass substrate. Therefore, a beneficial aspect of a temporary reduction in reaction rate between said compounds is that the gaseous streams can begin mixing without forming zinc oxide prematurely, i.e. before reaching the deposition surface of the glass substrate. It is also believed that the gaseous additive compound may enhance nucleation of the zinc oxide coating on the deposition surface.

In an embodiment, the zinc oxide coating is formed directly on the glass substrate. However, in other embodiments, the zinc oxide coating is formed either directly on or over a previously deposited conductive tin oxide coating. In an embodiment, the conductive tin oxide coating is a doped tin oxide ($SnO_2$:X) coating. Preferably, the doped tin oxide coating may be fluorine doped tin oxide ($SnO_2$:F).

In general, the deposition of a zinc oxide coating over a conductive tin oxide coating by a CVD process where only a single oxygen-containing compound is utilized forms a coated glass article with an increased sheet resistance. For example, the sheet resistance of a glass article comprising a glass substrate and a $SnO_2$:F coating deposited thereon may have a sheet resistance of about 15 Ohms/sq. or less depending on the thickness of and atomic percentage of fluorine in the $SnO_2$:F coating. However, after forming a zinc oxide coating over the $SnO_2$:F coating where the zinc oxide coating was formed utilizing only, for example, $H_2O$ (in the form of water vapor/steam) increases the sheet resistance of the coated glass article. In fact, the sheet resistance may increase significantly depending on the thickness of the zinc oxide coating formed thereon.

In stark contrast, the CVD process described herein, where a zinc-containing compound, preferably an alkyl zinc compound, a first gaseous inorganic oxygen-containing compound such as $H_2O$ and a second gaseous inorganic oxygen-containing compound such as $O_2$ are utilized to form the zinc oxide coating, maintains the sheet resistance of the coated glass article. In fact, the sheet resistance can be maintained within 0.5 Ohms/sq. of its measured value (as measured before the zinc oxide coating is deposited). Preferably, the sheet resistance can be maintained within 0.2 Ohms/sq. of its measured value. Even more preferably, the sheet resistance can be maintained within 0.1 Ohms/sq. of its measured value. Thus, utilizing the CVD process provides a coated glass article comprising a glass substrate, conductive tin oxide coating and zinc oxide coating which has a significantly lower sheet resistance than those known.

As such, a method for forming a coated glass article is also provided.

In an embodiment, the method for forming the coated glass article comprises providing the glass substrate. The glass substrate is as above-described. For example, the glass substrate may be moving at the time of forming the coated glass article. The glass substrate has a conductive tin oxide coating deposited thereon.

The coated glass article has a low sheet resistance. The conductive tin oxide coating provides the coated glass article with its low sheet resistance. The conductive tin oxide coating is as above-described. In embodiments where the conductive tin oxide coating is a doped tin oxide coating, the atomic percentage of dopant in and the thickness of the conductive tin oxide coating can be selected to provide the coated glass article with a desired low sheet resistance of, for example about 15 Ohms/sq. or less.

In an embodiment, the conductive tin oxide coating is a $SnO_2$:F coating. The atomic percentage of fluorine in and the thickness of the $SnO_2$:F coating may vary between embodiments of the method. However, in an embodiment, the atomic percentage of fluorine in the $SnO_2$:F coating is between about 0.2-1.0% and more preferably is about 0.7 atomic percent. Preferably, the $SnO_2$:F coating is formed at a thickness of between about 300-1000 nm. More preferably, the $SnO_2$:F coating is formed at a thickness of between about 400-440 nm.

In certain embodiments, the $SnO_2$:F coating is a pyrolytic coating. In these embodiments, the $SnO_2$:F coating may be formed using a halogen-containing tin compound. Preferred halogen-containing tin compounds are dimethyltin dichloride (DMT), tin tetrachloride ($SnCl_4$) and monobutyltin trichloride (MBTC). A preferred dopant compound for use in forming the $SnO_2$:F coating is hydrogen fluoride (HF). However, it should be appreciated that alternative compounds may be utilized in forming the $SnO_2$:F coating.

Additionally, the method may comprise providing an undoped tin oxide ($SnO_2$) coating over the conductive tin oxide coating prior to depositing the zinc oxide coating. In this embodiment, the $SnO_2$ coating may be formed using a halogen-containing tin compound. Preferred tin compounds for use in forming the $SnO_2$ coating are DMT, $SnCl_4$ and MBTC. In an embodiment, the $SnO_2$ coating is deposited directly on the conductive tin oxide coating at a thickness between about 5-100 nm. More preferably, the $SnO_2$ coating is deposited at a thickness of between about 50-80 nm.

As discussed above, the coated glass article comprises the glass substrate, conductive tin oxide coating and zinc oxide coating. In certain embodiments, the conductive tin oxide coating may be deposited directly on the glass substrate. However, in other embodiments, an iridescence-suppressing interlayer is formed on the glass substrate prior to forming the conductive tin oxide coating. Preferably, the iridescence-suppressing interlayer is deposited between the glass substrate and the conductive tin oxide coating. The iridescence-suppressing interlayer is provided so that the coated glass article has a neutral color in transmittance and reflectance. As will be discussed, the iridescence-suppressing interlayer may be a single coating layer or may comprise two or more discrete coating layers.

The method comprises forming a gaseous mixture. In an embodiment, in the gaseous mixture comprises the gaseous zinc-containing compound, first gaseous inorganic oxygen-containing compound, second gaseous inorganic oxygen-containing compound and inert gas. The gaseous mixture is formed over the conductive tin oxide coating. In an embodiment, the gaseous additive compound is included in the gaseous mixture.

The gaseous precursor compounds and inert gases are as above-described. The preferred zinc-containing compound is an organic zinc compound such as DEZ or, preferably, DMZ. The preferred first and second inorganic oxygen-containing compounds are $H_2O$ and $O_2$ and the preferred gaseous additive compound is acetyl acetone.

For any particular combination of gaseous precursor compounds, the optimum concentrations and flow rates for achieving a particular deposition rate and zinc oxide thickness may vary. However, in order to form a coated glass article having a sheet resistance which is maintained within 0.5 Ohms/sq. or less as is provided in the method described herein, the gaseous mixture preferably comprises DMZ, $H_2O$ (in the form of steam), molecular oxygen (in the form of $O_2$), and, optionally, a gaseous additive compound such as acetyl acetone. In this embodiment, the gaseous mixture comprises about 0.25 mol % or more DMZ, about 3 mol % or more $H_2O$, about 0.8 mol % or more $O_2$, and, optionally, about 0.04 mol % or more acetyl acetone with the balance being inert gas. Even more preferably, in an embodiment, the gaseous mixture comprises about 0.5 mol % or more DMZ, about 6 mol % or more $H_2O$, about 1.6 mol % or more $O_2$, and about 0.04 mol % or more acetyl acetone with the balance being inert gas.

Also, as should be appreciated, for any particular combination of gaseous precursor compounds, the optimum concentrations and flow rates for achieving a particular deposition rate may be determined by trial or by computer modeling. It will also be appreciated that the use of higher concentrations of a particular gaseous reactant compound and higher flow rates may result in less efficient overall conversion of the reactants into a zinc oxide coating, so that the optimum conditions for commercial operation may differ from the conditions which provide the highest deposition rates.

After the gaseous mixture is formed over the conductive tin oxide coating, the gaseous mixture reacts to form the zinc oxide coating over the conductive tin oxide coating and the sheet resistance is maintained within 0.5 Ohms/sq. Thus, a feature of the method is that it allows for the formation of the zinc oxide coating and the coated glass article to maintain its low sheet resistance. In certain embodiments, the zinc oxide coating can be formed to provide a coated glass article having a sheet resistance of less than 11 Ohms/sq. Known methods do not afford coated glass articles comprising the above-described coating layers at the below-described thicknesses with this advantageously low sheet resistance.

Therefore, a novel coated glass article is provided.

Figure 4:
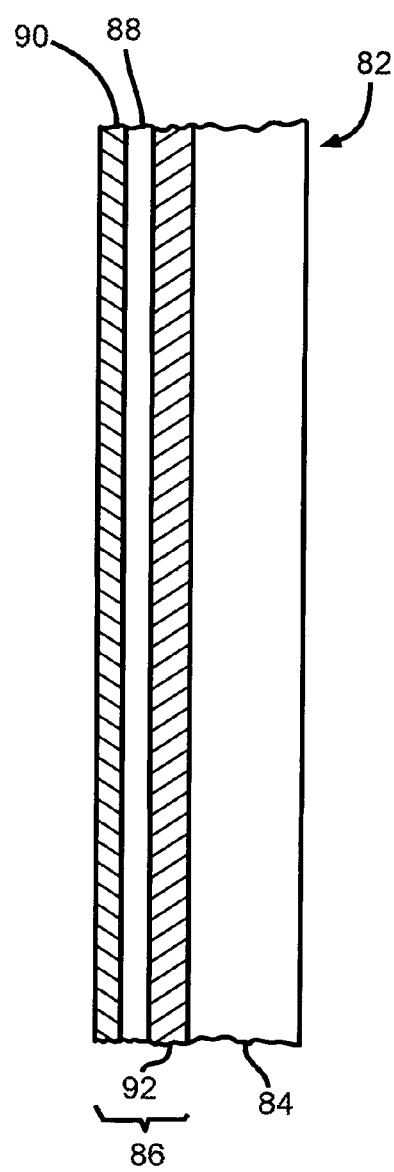
FIG. 4 is a broken sectional view of a coated glass article according to an embodiment of the invention.

FIG. 4 illustrates an embodiment of the coated glass article, indicated generally by reference numeral 82. The coated glass article 82 comprises the glass substrate 84 and a multilayered coating 86 adhered to one surface thereof. In an embodiment, the multilayered coating comprises a $SnO_2$:F coating 88 deposited on a surface of the glass substrate 84 and a zinc oxide coating 90 deposited over the $SnO_2$:F coating 88. In an embodiment, the multilayered coating 86 also comprises an iridescence-suppressing interlayer 92.

Figure 5:
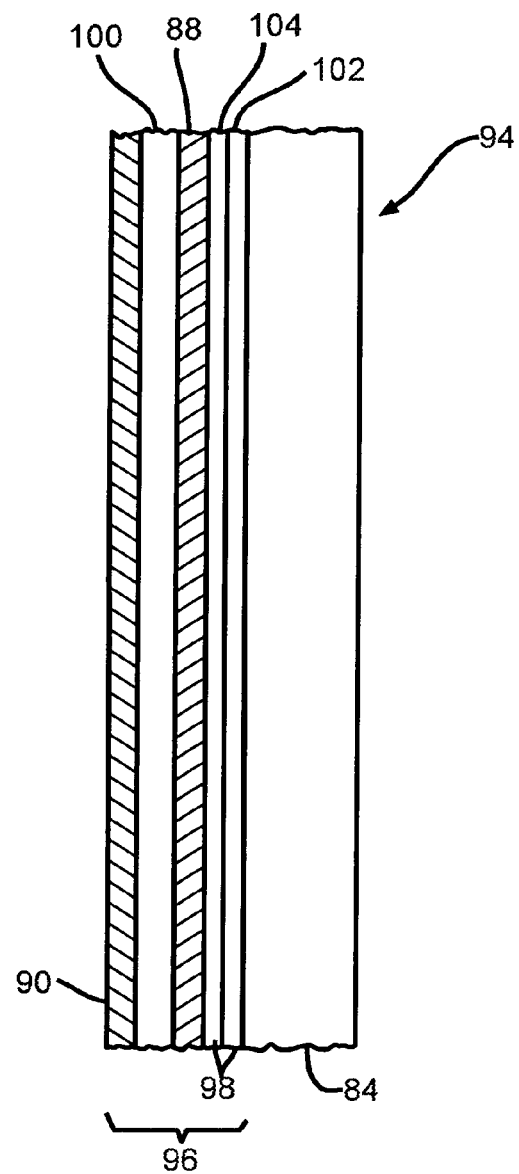
FIG. 5 is a broken sectional view of a coated glass article according to an embodiment of the invention.

FIG. 5 illustrates another embodiment of the coated glass article, indicated generally by reference numeral 94. The coated glass article 94 comprises a glass substrate 84 and a multilayered coating 96 adhered to one surface thereof. In an embodiment, the multilayered coating comprises an iridescence-suppressing interlayer 98, a $SnO_2$:F coating 88 deposited over the iridescence-suppressing interlayer 98, a zinc oxide coating 90 deposited over the $SnO_2$:F coating 88, and a $SnO_2$ coating 100 deposited between the $SnO_2$:F coating 88 and the zinc oxide coating 90. It should be appreciated that the $SnO_2$ coating 100 could be deposited between the $SnO_2$:F coating 88 and zinc oxide coating 90 in the coated glass article 82 illustrated in FIG. 4. Referring back to FIG. 5, the iridescence-suppressing interlayer 98 comprises a $SnO_2$ coating 102 and a silicon dioxide ($SiO_2$) coating 104. In this embodiment, the coated glass article 94 exhibits a sheet resistance of less than 11 Ohms/sq.

In the embodiments illustrated in FIGS. 4 and 5, the thickness of the $SnO_2$:F coating 88 and the atomic percentage of fluorine in the $SnO_2$:F coating 88 are selected such that the coated glass articles 82, 94 exhibit sheet resistances of about 15 Ohms/sq. or less prior to forming the zinc oxide coating 90. More preferably, the thickness of the $SnO_2$:F coating 88 and atomic percentage of fluorine in the $SnO_2$:F coating 88 are selected such that each coated glass article 82, 94 exhibits a sheet resistance of less than 11 Ohms/sq. prior to forming the zinc oxide coating 90 thereover.

The glass substrate 84 is as above-described.

The iridescence-suppressing interlayer 92, 98 provides a means to reflect and refract light to interfere with the observance of iridescence. The interlayer 92, 98 specifically eliminates iridescence so that the coated glass article 82, 94 may, if desired, be neutral colored in both reflectance and transmittance. Furthermore, the interlayer 92, 98 suppresses the observance of off angle colors. U.S. Pat. Nos. 4,187,336, 4,419,386, and 4,206,252, each herein incorporated by reference in their entirety, describe coating techniques suitable for suppressing interference colors. Single layer, multiple layer, or gradient layer coatings are suitable for use as an interlayer in the multilayered coatings 92, 98.

In the two component interlayer 98 illustrated in FIG. 5, which is the preferred type of iridescence-suppressing interlayer, the coating 102 deposited onto and adhering to the glass substrate has a high refractive index in the visible spectrum and is preferably $SnO_2$. The second coating 104, having a low refractive index, is deposited on and adheres to the first coating of the interlayer, and is preferably $SiO_2$. Generally, each coating layer 102, 104 has a thickness selected such that the interlayer 98 forms a combined total optical thickness of about $\frac{1}{6}^{th}$ to about $\frac{1}{12}^{th}$ of a 500 nm design wavelength.

In these embodiments, the $SnO_2$:F coating 88 provides the coated glass article with its low sheet resistance. The $SnO_2$:F coating 88 may be formed as above-described. Preferably, the $SnO_2$:F coating 88 is deposited over the iridescence-suppressing interlayer 92, 98. The thickness of the $SnO_2$:F coating 88 is at least 400 nm. The atomic percentage of fluorine in the $SnO_2$:F coating 88 is between about 0.2-1.0%. More preferably, the atomic percentage of fluorine when the $SnO_2$:F coating 88 is deposited at a thickness of between 400-440 nm is about 0.7 atomic percent.

The $SnO_2$ coating 100 may be formed as above-described. When provided, the thickness of the $SnO_2$ coating 100 is preferably between about 50-80 nm. Preferably, the $SnO_2$ coating 100 is pyrolytic. In these embodiments, it is preferred that the $SnO_2$ coating 100 is undoped. The $SnO_2$ coating 100 provides a further coating layer which is highly transparent but has a resistivity which is higher than that of the $SnO_2$:F coating 88. Thus, utilizing a $SnO_2$ coating 100 between the $SnO_2$:F coating 88 and zinc oxide coating 90 increases the sheet resistance of the coated glass article 94.

Preferably, the zinc oxide coating 90 is as above-described and is formed as above-described. In certain embodiments, the zinc oxide coating 90 is deposited at a thickness of 100 nm or less. In an embodiment, the thickness of the zinc oxide coating 90 is between 10-100 nm. More preferably, the thickness of the zinc oxide coating 90 is between 30-60 nm.

Preferably, the zinc oxide coating 90 is undoped. The zinc oxide coating 90 provides a coating layer which is highly transparent and has a higher resistivity than the $SnO_2$:F coating 88. Thus, it would be expected that when utilizing a zinc oxide coating over a $SnO_2$:F coating, the sheet resistance of the coated glass article 82, 94 would increase or further increase when a $SnO_2$ coating is utilized between the zinc oxide coating 90 and the $SnO_2$:F coating 88. However, forming the zinc oxide coating 90 as above-described provides a coated glass article 82, 94 that has a sheet resistance of 15 Ohms/sq. or less and preferably less than 11 Ohms/sq. Further, in certain embodiments, the sheet resistance of the coated glass article 82, 94 is the same or substantially the same as it would be if the zinc oxide coating 42, 63 was not provided. This surprising result is maintained even when a $SnO_2$ coating 100 is deposited between the $SnO_2$:F coating 88 and the zinc oxide coating 90. Additionally, in certain embodiments, the coated glass article 82, 94 exhibits a sheet resistance of less than 10 Ohms/sq.

The coated glass article 82, 94 may be utilized in combination with one or more additional coating layers to achieve a desired coating stack. The additional coating layer(s) may be formed in conjunction with the float glass manufacturing process shortly after forming the zinc oxide coating 90 and/or as part of another manufacturing process. Also, these additional coating layers may be formed by pyrolysis or by another coating deposition process.

As an example, additional coating layer(s) of thin-film photovoltaic materials, or other semiconductor materials, may be formed over the zinc oxide coating 90 so as to provide a desired coating stack. The photovoltaic materials, or other semiconductor materials, may be formed over the coated glass article during the manufacturing of solar cells. Since the coated glass article has a higher conductivity or a lower sheet resistance (when compared with previously known coated glass articles having the same coating stack), utilizing the coated glass article provided herein in the manufacture of solar cells results in higher solar cell efficiency and/or greater power output.

As above-described, the CVD process may be practiced with a float glass manufacturing process. Additionally, the method for forming a coated glass article may also be practiced with a float glass manufacturing process. Further, the coated glass article may be formed utilizing the float glass manufacturing process.

Referring back now to FIG. 1, in the exemplary float glass manufacturing installation 10, molten glass 14 flows along the canal beneath a regulating tweel 106 and downwardly onto the surface of the tin bath 26 in controlled amounts. On the molten tin surface, the molten glass 14 spreads laterally under the influence of gravity and surface tension, as well as certain mechanical influences, and it is advanced across the tin bath 26 to form the glass ribbon 18.

The glass ribbon 18 is removed from the float bath section 16 over lift out rolls 108 and is thereafter conveyed through the annealing lehr 20 and the cooling section 22 on aligned rolls. The formation/deposition of the coating layer(s) preferably takes place in the float bath section 11, although it may be possible for deposition to take place further along the glass production line, for example, in the gap 110 between the float bath section 16 and the annealing lehr 20, or in the annealing lehr 20.

FIG. 1 shows four coating apparatuses 34, 112, 114, 116 provided in the float bath chamber 32. When a plurality of coating apparatuses 34, 112, 114, 116 are provided, each may be at a predetermined distance above the glass ribbon 18. However, it should be appreciated that when the invention is utilized in conjunction with the float glass manufacturing process, one or more coating apparatus 34, 112, 114, 116 may be provided within the float bath chamber 32, the annealing lehr 20, and/or in the gap 110 between the float bath chamber 32 and the annealing lehr 20.

A suitable non-oxidizing atmosphere, generally nitrogen or a mixture of nitrogen and hydrogen in which nitrogen predominates, is maintained in the float bath chamber 32 to prevent oxidation of the molten tin comprising the tin bath 26. The atmosphere gas is admitted through conduits 118 operably coupled to a distribution manifold 120. The non-oxidizing gas is introduced at a rate sufficient to compensate for normal losses and maintain a slight positive pressure, on the order of about 0.001 to about 0.01 atmosphere above ambient atmospheric pressure, so as to prevent infiltration of outside atmosphere. As such, for purposes of describing the certain embodiments of the invention, the above-noted pressure range is considered to constitute normal atmospheric pressure.

As such, in certain embodiments, the CVD process and the method for forming a coated glass article may be practiced when the deposition surface of the glass substrate is at essentially atmospheric pressure. It should also be noted that in addition to the pressure of the float bath chamber 32, the pressure of the annealing lehr 20 and/or or in the gap 110 between the float bath section 16 and the annealing lehr 20 may be essentially atmospheric pressure where a coating apparatus 34, 112, 114, 116 may be located to practice embodiments of the invention described herein. Also, the CVD process and method for forming a coated glass article are not limited to operating essentially at or near atmospheric pressure as the zinc oxide coating may be formed under low-pressure conditions.

Heat for maintaining the desired temperature regime in the tin bath 26 and the chamber 32 is provided by radiant heaters 122 within the chamber 32. The atmosphere within the lehr 20 is typically atmospheric air, as the cooling section 22 is not enclosed and the glass ribbon 18 is therein open to the ambient atmosphere. Ambient air may be directed against the glass ribbon 18 as by fans 124 in the cooling section. Heaters may also be provided within the annealing lehr 20 for causing the temperature of the glass ribbon 18 to be gradually reduced in accordance with a predetermined regime as it is conveyed therethrough.

EXAMPLES

In TABLE 1 the column listing the thickness of the zinc oxide coatings is designated with a ZnO. Certain examples within the scope of the invention are listed in TABLE 1 as Ex 1-Ex 7. However, Ex 1-Ex 7 are for illustrative purposes only and are not to be construed as a limitation on the invention. Comparative examples not considered to be a part of the invention are designated as C1, C2, and C3.

The coated glass articles in TABLE 1 (including C1, C2, C3 and Ex 1-Ex 7) are of a glass/$SnO_2$/$SiO_2$/$SnO_2$:F/ZnO configuration. The coating layers were deposited on a soda-lime-silica glass substrate while the substrate was moving. Prior to forming the zinc oxide coating, pyrolytic $SnO_2$ and $SiO_2$ coatings were each deposited at a thickness of between about 21-25 nm over the glass substrate. After forming the $SnO_2$ and $SiO_2$ coatings, a pyrolytic $SnO_2$:F coating was deposited at a thickness of between about 400-440 nm over the $SiO_2$ coating. The atomic percentage of fluorine in the $SnO_2$:F coating was about 0.7%. A pyrolytic zinc oxide coating was then deposited over the $SnO_2$:F coating.

A coating apparatus was used to form each coating layer on the glass substrate. The glass substrate was transported through a belt conveyor furnace, more specifically, a three zone furnace, having a substrate heating zone, a coating zone, and a cool down zone. The other coating layers ($SnO_2$/$SiO_2$/$SnO_2$:F) had been previously deposited on the glass substrate. Each substrate was loaded onto the conveying belt and allowed to heat-up so that the glass temperature was 621° C. (1150° F.) before the substrate passed under the coating apparatus utilized to form the zinc oxide coatings.

To form the zinc oxide coating of Ex 1-Ex 7, a gaseous mixture comprising DMZ and an inert gas utilized as carrier gas was formed as a first stream. Additionally, gaseous acetyl acetone was provided in the first stream. A second stream comprising $H_2O$ and $O_2$ was also provided. Inert gas utilized as carrier gas was included in the second stream. The streams were directed through the coating apparatus. To form the zinc oxide coating for C1, C2, and C3, a gaseous mixture of DMZ and a carrier gas was formed as a first stream. Gaseous acetyl acetone was provided in the first stream. A second stream including $H_2O$ and inert gas was also provided. The streams were directed through the coating apparatus.

The total gas flows for Ex 1-Ex 7 and C1-C3 were substantially equal. The glass substrate was passed under the coating apparatus and the gaseous streams were mixed at or near the deposition surface of the glass substrate as it moved under the coating apparatus to form the zinc oxide coating thereon. Substantially all of the input spent/unused gases were exhausted so as not to interfere with the deposition process.

The amounts of the individual gaseous precursor compounds are as listed in TABLE 1. Line speed, i.e. the speed of the glass substrate moving beneath the coating apparatus are reported in inches per min (IPM) as listed in TABLE 1. The zinc oxide coating thicknesses listed in TABLE 1 were calculated using reflection and are reported in nanometers. Also, the sheet resistances ($R_s$) of the coated glass articles produced under the conditions above-described for Ex 1-Ex 7 and C1-C3 were measured using a four-point probe and are reported in Ohms per square (Ohms/sq.).

TABLE 1

| Examples Comp. Ex | Mol % DMZ | Mol % $H_2O$ | Mol % acac | Mol % $O_2$ | ZnO (nm) | Line Speed | $R_s$ (Ohms/sq) |
|---|---|---|---|---|---|---|---|
| C1 | 0.5 | 10 | 0.05 | 0 | 24.3 | 200 | 13.1 |
| C2 | 0.5 | 10 | 0.05 | 0 | 38.0 | 125 | 14.3 |
| C3 | 0.5 | 10 | 0.05 | 0 | 72.5 | 125 | 16.4 |
| Ex 1 | 0.5 | 6 | 0.04 | 0.8 | 27.9 | 300 | 10.3 |
| Ex 2 | 0.75 | 10 | 0.04 | 1.6 | 38.5 | 300 | 10.0 |
| Ex 3 | 1.0 | 10 | 0.04 | 1.6 | 60.1 | 300 | 10.0 |
| Ex 4 | 1.0 | 6 | 0.04 | 1.6 | 43.5 | 300 | 10.4 |
| Ex 5 | 1.0 | 10 | 0.04 | 0.8 | 53.0 | 300 | 10.4 |
| Ex 6 | 1.0 | 3 | 0.04 | 0.8 | 55.0 | 300 | 9.8 |
| Ex 7 | 0.75 | 10 | 0.04 | 1.6 | 34.0 | 300 | 9.9 |

As shown by Ex 1-Ex 7, the present invention provides an improved process and method which maintains the sheet resistance of the coated glass article after a zinc oxide coating is formed. Additionally, coated glass articles having an improved sheet resistance are provided.

For example, for Ex 1 the zinc oxide coating thickness was 27.9 nm and for C1 the zinc oxide coating thickness was 24.3 nm. However, the sheet resistance for the coated glass article of Ex 1 was only 10.3 Ohms/sq. compared to a sheet resistance of 13.1 Ohms/sq. for the coated glass article formed under the conditions of C1. In fact, for all of the coated glass articles formed under the conditions of Ex 1-Ex 7 the sheet resistances were less than 11 Ohms/sq. even though the zinc oxide coating thicknesses varied from about 28 nm to over 60 nm. In stark contrast, as the thickness of the zinc oxide coatings formed using the known processes/methods represented by C1-C3, the sheet resistance of the coated glass articles increased dramatically.

In TABLE 2 the column listing the thickness of the zinc oxide coatings is designated with a ZnO. The example in TABLE 2 within the scope of the invention is listed as Ex 8. However, Ex 8 is only for illustrative purposes only and is not to be construed as a limitation on the invention. Comparative examples not considered to be a part of the invention are designated as C4, C5, C6 and C7.

The coated glass articles of C4 and C5 are of a glass/$SnO_2$/$SiO_2$/$SnO_2$:F/$SnO_2$ configuration. For C4 and C5 the thicknesses of the $SnO_2$/$SiO_2$/$SnO_2$:F coating layers are as above-described. For C4 and C5, the $SnO_2$ coating deposited over the $SnO_2$:F coating is a pyrolytic coating layer which was deposited at a thickness of 70-80 nm. The improvement in sheet resistance from C4 ($R_s$=9.51) to C5 ($R_s$=9.21) can be attributed to a thermal heat treatment that the coated glass article of C5 underwent.

The coated glass articles of C6, C7 and Ex 8 are of a glass/$SnO_2$/$SiO_2$/$SnO_2$:F/$SnO_2$/ZnO configuration. The thicknesses of the $SnO_2$/$SiO_2$/$SnO_2$:F coating layers are as above-described. In C6, C7 and Ex 8 the $SnO_2$ coating layer deposited over the $SnO_2$:F coating is as above-described for C4 and C5.

To form the zinc oxide coating for C6 and C7, the experimental conditions and gaseous precursor compound quantities utilized were similar to those above-described for C1-C3. As with the C1-C3, a second inorganic oxygen-containing compound was not utilized in forming the zinc oxide coatings of C6 and C7 (as is listed in TABLE 2).

To form the zinc oxide coating for Ex 8, a gaseous mixture comprising DMZ and an inert gas was formed as a first stream. Additionally, gaseous acetyl acetone was included in the first stream. A second stream comprising $H_2O$ and $O_2$ was also provided. Inert carrier gas was also included in the second stream. The streams were directed through the coating apparatus and mixed at or near a surface of the glass substrate as it moved under the coating apparatus to form the zinc oxide coating thereon. For Ex 8, the amount of $O_2$ utilized to form the zinc oxide coating is as listed in TABLE 2. As above-noted, in C6 and C7 $O_2$ was not utilized in forming the zinc oxide coatings.

The zinc oxide coating thicknesses and the sheet resistance ($R_s$) of the coated glass articles for C6, C7, and Ex 8 were calculated and measured as above-described for Ex 1-Ex 7 and C1-C3.

TABLE 2

| Examples Comp. Ex | $O_2$ Mol % | Thickness ZnO (nm) | $R_s$ (Ohms/sq) |
|---|---|---|---|
| C4 | N/A | N/A | 9.51 |
| C5 | N/A | N/A | 9.21 |
| C6 | 0 | 33.7 | 12.2 |
| C7 | 0 | 68.1 | 26.9 |
| Ex 8 | 1.0 | 40.0 | 9.26 |

The sheet resistances of the coated glass articles of C4 and C5 are below 10 Ohms/sq. However, when a zinc oxide coating is formed over a coated glass article having the configuration of C4 and C5 utilizing the known processes/methods for depositing zinc oxide coatings, the result is a significant rise in sheet resistance of the coated glass article as illustrated by the sheet resistance values reported for C6 and C7. For example, the zinc oxide coating thickness for C6 was 33.7 nm and the sheet resistance for the coated glass article was 12.2 Ohms/sq.

However, as shown by Ex 8, the sheet resistance of the coated glass article is maintained within 0.5 Ohms/sq. and, more preferably, within 0.2 Ohms/sq. or less of its measured value with the CVD process and method described herein. For Ex 8, the zinc oxide coating thickness was 40.0 nm. Nonetheless, the sheet resistance for the coated glass article of Ex 8 was only 9.26 Ohms/sq. Thus, the coated glass article provided has an improved sheet resistance as illustrated by a comparison of the sheet resistance values for C4 and Ex 8 and C6 and Ex 8, respectively.

Hence, the CVD process and the method for forming the coated glass article offer improvements over the known comparative deposition processes and methods. Additionally, the coated glass article embodiments described herein have lower sheet resistances than coated glass articles having the same or substantially the same coating layer configuration made by the known processes and methods. Further, in some instances, the sheet resistances of the coated glass articles are lower than those with fewer high resistivity coating layers formed over a conductive tin oxide coating.

From the foregoing disclosure and detailed description of certain preferred embodiments, it will be apparent that various modifications, additions, and other alternative embodiments are possible without departing from the true scope and spirit of the invention. The embodiments discussed were chosen and described to provide the best illustration of the principles of the invention and its practical application to thereby enable one of ordinary skill in the art to use the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A chemical vapor deposition process for depositing a zinc oxide coating, comprising:
   providing a moving glass substrate;
   forming a gaseous mixture comprised of an alkyl zinc compound and an inert gas as a first stream;
   providing a first gaseous inorganic oxygen-containing compound in a second stream;
   providing a second gaseous inorganic oxygen-containing compound in the second stream, in a third stream, or in both the second and third streams;
   providing acetyl acetone in the first stream, second stream, third stream or another stream; and
   mixing the gaseous streams at or near a surface of the moving glass substrate to form a zinc oxide coating thereon.

2. The process defined in claim 1, wherein the streams are directed through a coating apparatus prior to forming the zinc oxide coating.

3. The process defined in claim 1, wherein the first inorganic oxygen-containing compound is water and the second inorganic oxygen-containing compound is oxygen.

4. The process defined in claim 1, wherein the zinc oxide coating is a pyrolytic coating.

5. The process defined in claim 1, wherein the zinc oxide coating is formed on a glass ribbon in a float glass manufacturing process at essentially atmospheric pressure.

6. The process defined in claim 1, wherein a fluorine doped tin oxide coating is deposited over the surface of the glass substrate prior to forming the zinc oxide coating.

7. The process defined in claim 2, wherein the gaseous streams are separately directed through a coating apparatus prior to being mixed.

8. The process defined in claim 2, further comprising discharging the gaseous streams from the coating apparatus at the predetermined distance above the glass substrate.

9. The process defined in claim 1, wherein the alkyl zinc compound is dimethyl zinc and the first and second inorganic oxygen-containing compounds are water and oxygen.

10. The process defined in claim 6, wherein a tin oxide coating is deposited over the fluorine doped tin oxide coating prior to forming the zinc oxide coating.

* * * * *